(12) United States Patent
Wang et al.

(10) Patent No.: US 9,625,520 B2
(45) Date of Patent: Apr. 18, 2017

(54) LATCH-UP TEST DEVICE AND METHOD FOR TESTING WAFER UNDER TEST

(71) Applicant: MACRONIX International Co., Ltd., Hsinchu (TW)

(72) Inventors: Shih-Yu Wang, Hsinchu (TW); Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/792,148

(22) Filed: Jul. 6, 2015

(65) Prior Publication Data
US 2017/0010321 A1    Jan. 12, 2017

(51) Int. Cl.
*G01R 31/00*    (2006.01)
*G01R 31/28*    (2006.01)
*G01R 1/04*    (2006.01)

(52) U.S. Cl.
CPC ....... *G01R 31/2853* (2013.01); *G01R 1/0491* (2013.01)

(58) Field of Classification Search
CPC ... G11C 29/46; G11C 11/406; G11C 11/4072; G11C 11/4076; G11C 29/12005; G11C 29/40; G11C 29/42; G11C 29/50; G11C 7/222; G11C 7/227; G11C 5/147; G11C 11/4074; G11C 5/145; G11C 5/005; G01R 31/318541; G01R 31/318594; G01R 19/16557; G01R 31/002; G01R 31/31701; G01R 31/3177; G01R 31/318555; G01R 29/027; G01R 31/31704; G01R 31/31708; G01R 31/31709; G01R 31/31816; G01R 27/00; G01R 31/024; G01R 31/14; G01R 31/26; G01R 31/2856; G01R 31/2853; G01R 31/001; G01R 31/3004; G01R 19/04; G01R 19/16538; G01R 19/16576; G01R 1/0408; G01R 31/2621; G01R 31/2831; G01R 31/2886; G01R 31/31713; G01R 33/02; G06F 11/00; G06F 11/0706;
(Continued)

(56) References Cited

U.S. PATENT DOCUMENTS 6,469,538 B1 * 10/2002 Gupta ................ G01R 31/3004 324/750.3
6,636,067 B1 * 10/2003 Salcedo-Suner ... G01R 31/3004 324/762.02

(Continued)

*Primary Examiner* — Vinh Nguyen
(74) *Attorney, Agent, or Firm* — J.C. Patents

(57) ABSTRACT

Latch-up test device and method are provided, and the method includes following steps. A set operation is performed for setting a basic test value according to a test range and setting a trigger pulse and a predetermined error value by the basic test value. A test on a test chip in a wafer under test is performed by the trigger pulse, and whether the test chip is in a latch-up state is determined. Whether to update a test range and a latch-up threshold value and whether to return to the step of performing the set operation are determined according to a determination result, the latch-up threshold value and the basic test value. When the test chip is in the latch-up state and a difference between the latch-up threshold value and the basic test value is not greater than the predetermined error value, the test on the test chip is stopped.

8 Claims, 4 Drawing Sheets

(58) Field of Classification Search
CPC .............. G06F 11/079; G06F 11/1604; G06F 11/1608; G06F 11/104; G06F 11/0751; G06F 11/263; G06F 17/5022; G06F 17/5045; G06F 17/5081; G06F 13/4256; H03K 5/19; H01L 22/34; H01L 27/0207; H01L 27/0292; H01L 27/10897; H01L 27/0288
See application file for complete search history.

(56) References Cited

U.S. PATENT DOCUMENTS

| | | | |
|---|---|---|---|
| 6,985,002 B2* | 1/2006 | Salcedo | G01R 31/2853 324/762.02 |
| 7,089,137 B2* | 8/2006 | Wang | G01R 31/2853 324/756.05 |

* cited by examiner

LATCH-UP TEST DEVICE AND METHOD FOR TESTING WAFER UNDER TEST

BACKGROUND OF THE INVENTION

Field of the Invention

The invention relates to a latch-up test device and a latch-up test method, and more particularly, to a latch-up test device and a latch-up test method capable of testing a wafer under test.

Description of Related Art

A latch-up effect is an important factor that influences a reliability of an integrated circuit, and thus a test for an anti-latch-up capability is usually performed on the integrated circuit before leaving the factory. Generally, a manufacturing process of the integrated circuit includes a circuit design, a chip fabrication and a chip packaging. Further, in conventional latch-up test methods, a trigger pulse that increases linearly is utilized to perform a latch-up test on the integrated circuit at the chip packaging stage. However, because said trigger pulse is gradually increased in a linear manner, it often consumes an extremely-long testing time to complete the test for the anti-latch-up capability of the integrated circuit in the conventional latch-up test methods. In addition, since only the integrated circuit at the chip packaging stage can be tested by the conventional latch-up test methods, manufacturers must wait until the integrated circuit is in the last stage of the manufacturing process before determining whether to re-manufacture the integrated circuit, resulting in increases in both the production cost and the production time for the integrated circuit.

SUMMARY OF THE INVENTION

The invention is directed to a latch-up test device and a latch-up test method, which are capable of reducing the testing time to facilitate in reduction of the production cost and the production time.

The latch-up test method of the invention includes the following steps. A set operation is performed to select one of a plurality of test values covered by a test range as a basic test value and to set a trigger pulse and a predetermined error value by using the basic test value. The basic test value divides the test range into a first sub-range and a second sub-range. A test on a test chip in a wafer under test is performed by using the trigger pulse to obtain at least one detection signal. Whether the test chip is in a latch-up state is determined according to the at least one detection signal. When the test chip is not in the latch-up state, the test range is updated according to the first sub-range and the method returns to the step of performing the set operation. When the test chip is in the latch-up state and a difference between a latch-up threshold value and the basic test value is greater than the predetermined error value, the latch-up threshold value and the test range are updated according to the basic test value and the second sub-range respectively, and the method returns to the step of performing the set operation. When the test chip is in the latch-up state and the difference between the latch-up threshold value and the basic test value is not greater than the predetermined error value, the test on the test chip is stopped.

The latch-up test device of the invention includes a signal generator, a signal detector and a controller. The controller selects one of a plurality of test values covered by a test range as a basic test value, and sets a trigger pulse and a predetermined error value by using the basic test value. The basic test value divides the test range into a first sub-range and a second sub-range. The signal generator generates the trigger pulse according to the basic test value, and transmits the trigger pulse to a test chip in a wafer under test so that the latch-up test device performs a test on the test chip. The signal detector detects a signal from the test chip to obtain at least one detection signal, and the controller determines whether the test chip is in a latch-up state according to the at least one detection signal. When the test chip is not in the latch-up state, the controller updates the test range according to the first sub-range and resets the trigger pulse according to the updated test range so that the latch-up test device performs the test on the test chip again. When the test chip is in the latch-up state and a difference between a latch-up threshold value and the basic test value is greater than the predetermined error value, the controller updates the latch-up threshold value and the test range according to the basic test value and the second sub-range respectively so that the latch-up test device performs the test on the test chip again. When the test chip is in the latch-up state and the difference between the latch-up threshold value and the basic test value is not greater than the predetermined error value, the latch-up test device stops the test on the test chip.

Based on the above, the invention is capable of adjusting the test range and selecting the corresponding basic test value in response to the test range, so as to set the trigger pulse for the test on the wafer under test. Accordingly, the testing time may be reduced to facilitate in reduction of the production cost and the production time.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
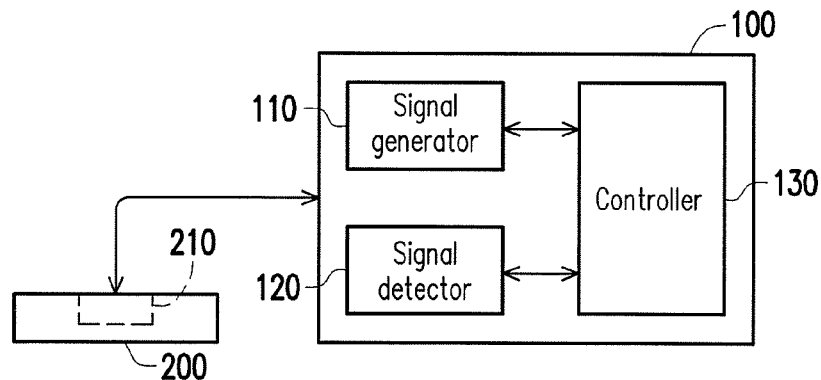
FIG. 1 is a schematic diagram of a latch-up test device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of a latch-up test device according to an embodiment of the invention. As shown in FIG. 1, a latch-up test device 100 may be, for example, a testing machine for testing a wafer under test 200. The wafer under test 200 includes a test chip 210, and the test chip 210 includes an integrated circuit. The latch-up test device 100 may be electrically connected to the wafer under test 200 through a probe on a probe card (not shown), so as to perform various tests (e.g., a latch-up test) on the integrated circuit in the test chip 210 of the wafer under test 200.

The latch-up test device 100 includes a signal generator 110, a signal detector 120 and a controller 130. The signal generator 110 is capable of generating a trigger pulse and transmitting the trigger pulse to the test chip 210 through the probe. Further, the controller 130 may adjust a magnitude (e.g., amplitude) of the trigger pulse according to a basic test value, so as to simulate various triggering sources capable of inducing a latch-up in the test chip 210. The signal detector 120 is capable of detecting signals on the test chip 210 through the probe so that the controller 130 may analyze characteristics or states of the test chip 210 and accordingly verify the anti-latch-up capability of the integrated circuit in the test chip 210.

Figure 2:
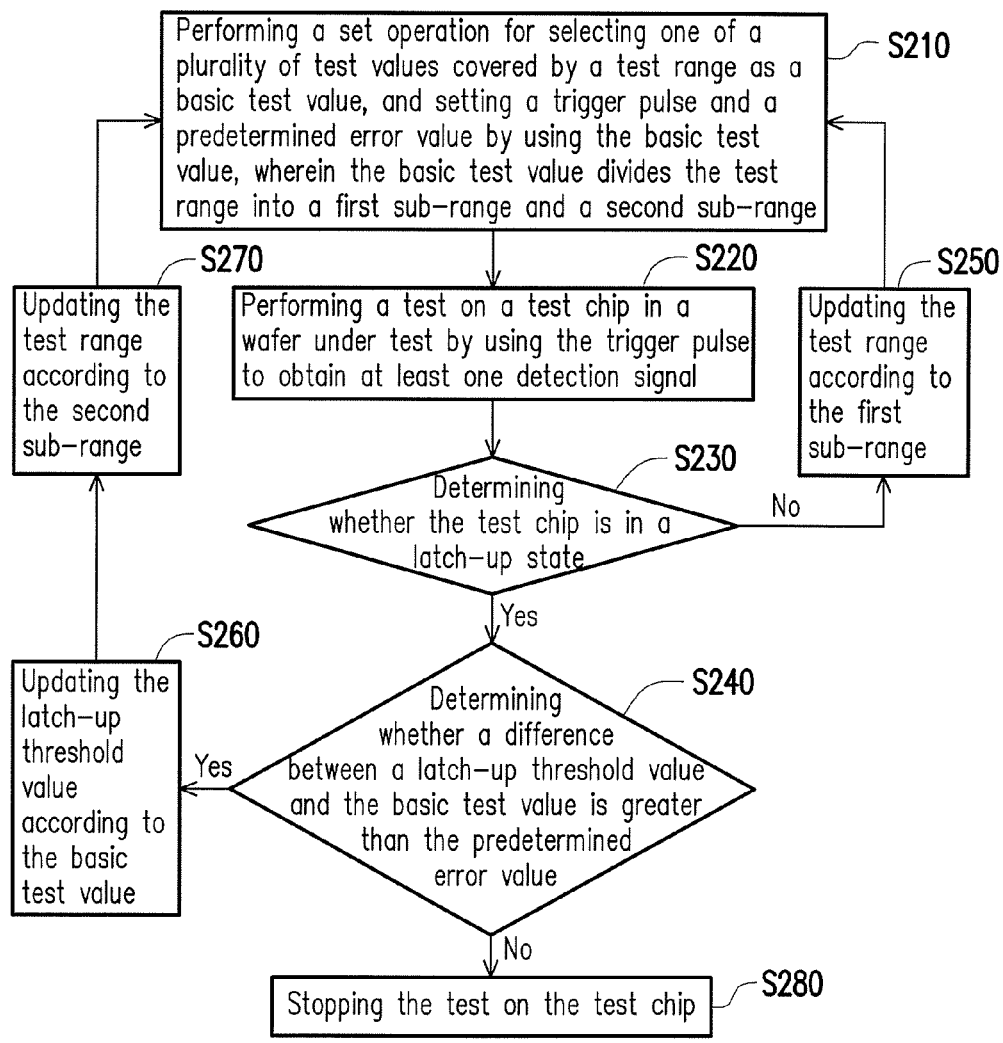
FIG. 2 is a flowchart of a latch-up test method according to an embodiment of the invention.

FIG. 2 is a flowchart of a latch-up test method according to an embodiment of the invention, and the latch-up test performed on the wafer under test 200 by the latch-up test device 100 is further described with reference to both FIG. 1 and FIG. 2. As shown in step S210, the latch-up test device 100 may perform a set operation to set a basic test value, a trigger pulse and a predetermined error value. Specifically, the controller 130 in the latch-up test device 100 selects one of a plurality of test values covered by a test range as the basic test value, and set the trigger pulse and the predetermined error value by using the basic test value. The basic test value divides the test range into a first sub-range and a second sub-range.

Figure 3:
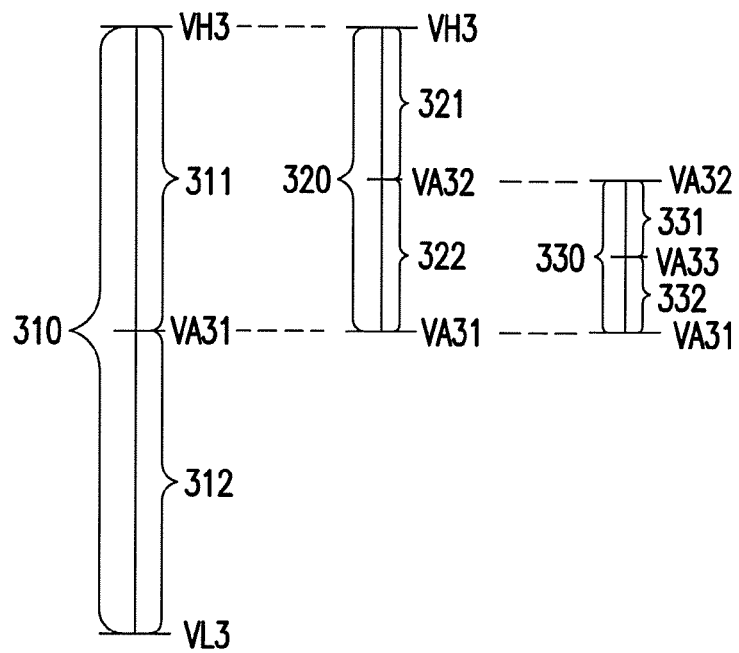
FIG. 3 is a schematic diagram illustrating adjustments on the test range according to an embodiment of the invention.

For instance, FIG. 3 is a schematic diagram illustrating adjustments on the test range according to an embodiment of the invention. As shown in FIG. 3, the test range may be a value range 310 from a test value VL3 to a test value VH3. The controller 130 may set the test value VA31 in the value range 310 as the basic test value so that the trigger pulse may be set according to the basic test value. Besides, the controller 130 may calculate the predetermined error value by substituting the basic test value VA31 into a formula. For instance, if $VA31 = a \times 10^b$, the calculated predetermined error value may be represented as $10^{(b-2)}$, wherein $1 \le a < 10$ and b is an integer. Namely, when the basic test value VA31 is equal to 300 mA, the calculated predetermined error value is equal to 1 mA. When the basic test value VA31 is equal to 20 mA, the calculated predetermined error value is equal to 0.1 mA. Further, the basic test value VA31 may divide the value range 310 into a first sub-range 311 and a second sub-range 312. The test values in the first sub-range 311 are greater than the basic test value VA31, and the test values in the second sub-range 312 are less than the basic test value VA31.

As shown in step S220, the signal generator 110 may generate the trigger pulse according to the basic test value. Besides, the signal generator 110 may transmit the basic test value to the test chip 220 so that the latch-up test device 100 performs a test on the test chip 210. The signal detector 120 may detect the signals from the test chip 220 and generate at least one detection signal accordingly. Furthermore, as shown in step S230 and step S240, the controller 130 may determine whether the test chip 210 is in a latch-up state according to the at least one detection signal and determine whether a difference between a latch-up threshold value and the basic test value is greater than a predetermined error value.

When the controller 130 determines that the test chip 210 is not in the latch-up state (i.e., the latch-up effect does not occur on the integrated circuit in the test chip 210), as shown in step S250, the controller 130 may update the test range according to the first sub-range, and the method goes back to step S210. For instance, as shown in FIG. 3, when a test result obtained by using the test value VA31 is that the latch-up effect does not occur on the test chip 210, the controller 130 may update the test range according to the first sub-range 311 so that the test range is updated to be a value range 320 from the test value VA31 to the test value VH3. Further, the latch-up test device 100 may repeat step S210 to select the test value VA32 from the updated test range (i.e., the value range 320) as a new basic test value, and reset the trigger pulse and the predetermined error value by using the new basic test value (i.e., the test value VA32). The new basic test value (i.e., the test value VA32) may divide the updated test range (i.e., the value range 320) into a first sub-range 321 and a second sub-range 322.

Furthermore, the latch-up test device 100 may repeat steps S210 to S230, so as to perform the test on the test chip 210 by using the reset trigger pulse again, and analyze the test result of the test chip 210 again. On the other hand, when the controller 130 determines that the test chip 210 is in the latch-up state (i.e., the latch-up effect occurs on the integrated circuit in the test chip 210) and the difference between the latch-up threshold value and the basic test value is greater than the predetermined error value, as shown in step S260 and step S270, the controller 130 may update the latch-up threshold value according to the basic test value and update the test range according to the second sub-range.

For instance, as shown in FIG. 3, when a test result obtained by using the test value VA32 is that the latch-up effect occurs on the test chip 210 and the difference between the latch-up threshold value and the basic test value is greater than the predetermined error value, the controller 130 may update the latch-up threshold value according to the basic test value (i.e., the test value VA32) and may update the test range according to the second sub-range 322 so that the test range is updated to be a value range 330 from the test value VA31 to the test value VA32. Further, the latch-up test device 100 may repeat step S210 to select the test value VA33 from the updated test range (i.e., the value range 330) as a new basic test value, and reset the trigger pulse and the predetermined error value by using the new basic test value (i.e., the test value VA33). The new basic test value (i.e., the test value VA33) may divide the updated test range (i.e., the value range 330) into a first sub-range 331 and a second sub-range 332.

By analogy, the latch-up test device 100 may constantly update the test range and reset the trigger pulse by using the updated test range, so as to perform the test on the test chip 210 again. Further, when the test result of the test chip 210 is that the test chip 210 is in the latch-up state and the difference between the latch-up threshold value and the basic test value is not greater than the predetermined error value, as shown in step S280, the latch-up test device 100 stops the test on the test chip 210. As a result, the final latch-up threshold value obtained by the latch-up test device 100 may be used to define a protection capability of the integrated circuit in the test chip 210 with respect to the latch-up effect.

Figure 4:
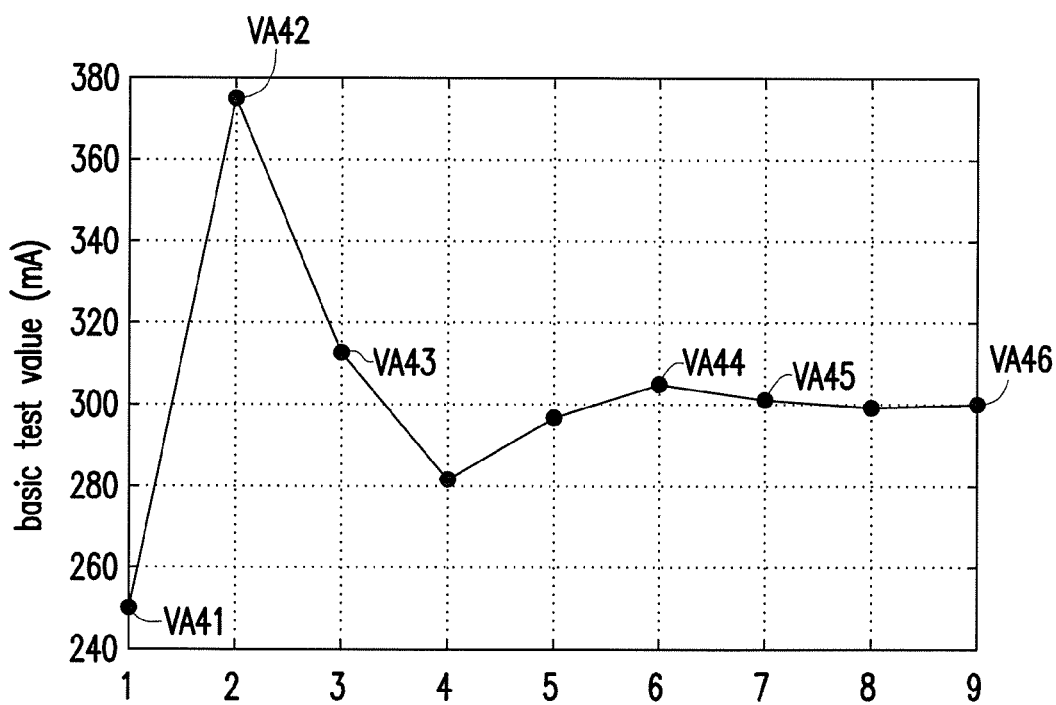
FIG. 4 is a schematic diagram illustrating variations on the basic test value when the test range changes according to an embodiment of the invention.

It is worth mentioning that, since the latch-up test device 100 is capable of constantly updating the test range, the latch-up test device 100 may complete the test on the test chip 210 by a fewer number of tests. For instance, FIG. 4 is a schematic diagram illustrating variations on the basic test value when the test range changes according to an embodiment of the invention. In the embodiment of FIG. 4, an initial test range may be, for example, 0 to 500 mA. In a first test, the latch-up test device 100 performs the test on the test chip 210 according to a basic test value VA41 (i.e., 250 mA), and a test result being analyzed is that the test chip 210 is not in the latch-up state. Therefore, the latch-up test device 100 updates the test range by using an upper-half range (i.e., the first sub-range) of the test range. Accordingly, in a second test, the latch-up test device 100 may perform the test on the test chip 210 according to a basic test value VA42 (i.e., 375 mA) which is greater than the basic test value VA41.

Further, a test result of the second test is that the latch-up effect occurs on the test chip 210 and the difference between the latch-up threshold value and the basic test value is greater than the predetermined error value. Therefore, the latch-up test device 100 may update the test range by using a lower-half range (i.e., the second sub-range) of the test range, and update the latch-up threshold value by using the basic test value VA42. Accordingly, in a third test, the latch-up test device 100 may perform the test on the test chip 210 according to a basic test value VA43 (i.e., 312.5 mA) which is smaller than the test value VA42. Further, according to the test result of the third test, the latch-up test device 100 may update the latch-up threshold value by using the basic test value VA43.

By analogy, the latch-up test device 100 may constantly update the test range and adjust the basic test value accordingly. Further, according to the test result, the latch-up test device 100 may update the latch-up threshold value by using a basic test value VA44 (i.e., 304.6875 mA) and a basic test value VA45 (i.e., 300.78125 mA) in sequence. In addition, in a ninth test, the latch-up test device 100 may perform the test on the test chip 210 according to a basic test value VA46 (i.e., 299.8203125 mA). Further, a test result of the ninth test is that the test chip 210 is in the latch-up state and the difference between the latch-up threshold value and the basic test value is not greater than the predetermined error value (1 mA). As a result, the latch-up test device 100 stops the test on the test chip 210 and the final latch-up threshold value (i.e., 300.78125 mA) being obtained may be used to define the anti-latch-up capability of the integrated circuit in the test chip 210.

It is worth mentioning that, the trigger pulse is gradually increased in the linear manner in the conventional latch-up test methods. As such, in the conventional latch-up test methods, the latch-up test on the test chip 210 must be repeatedly performed by using the trigger pulse which is sequentially increased to 1 mA, 2 mA, 3 mA, . . . , 300 mA. In other words, the latch-up test must be repeatedly performed for 300 times before the anti-latch-up capability of the test chip 210 may be verified. Therefore, as compared to the conventional latch-up test methods, the latch-up test device 100 is capable of effectively reducing a testing time for the test chip 210. Besides, the latch-up test device 100 may directly perform the test on the test chip 210 in the wafer under test 200. Namely, the latch-up test device 100 is capable of performing the latch-up test on the integrated circuit at the chip fabrication stage. Therefore, as compared to the conventional latch-up test methods, the latch-up test device 100 is capable of effectively reducing the production cost and the production time for the integrated circuit.

Figure 5:
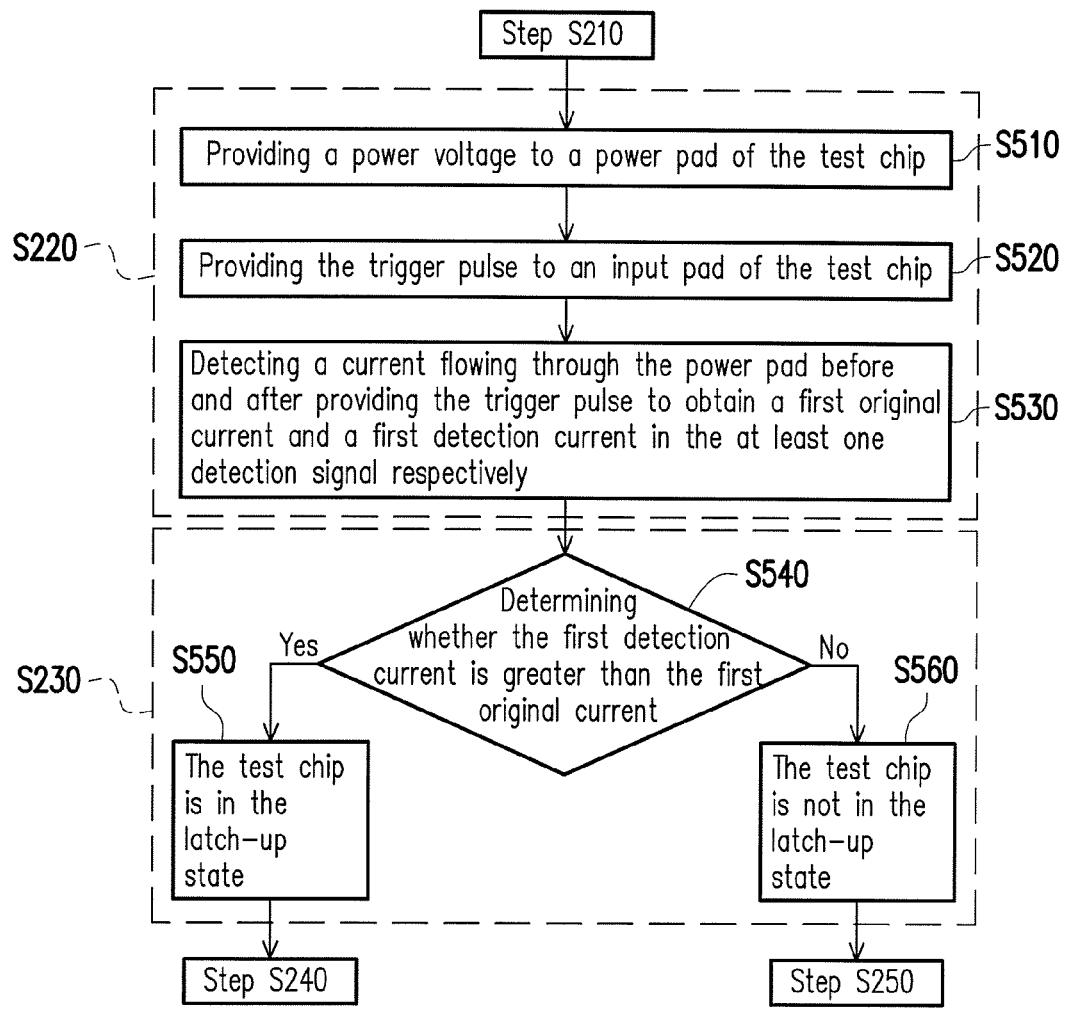
FIG. 5 is a flowchart illustrating detailed steps in steps S220 and S230 according to an embodiment of the invention.

In order to make the invention more comprehensible for those skilled in the art, detailed steps in step S220 and step S230 in FIG. 2 are further described as follows. For instance, FIG. 5 is a flowchart illustrating detail step in steps S220 and S230 according to an embodiment of the invention.

With respect to the detailed steps in step S220, as shown in step S510 and step S520, the signal generator 110 may provide a power voltage to a power pad of the test chip 210 and may provide the trigger pulse to an input pad of the test chip 210. Further, as shown in step S530, the signal detector 120 may detect a current flowing through the power pad before and after the trigger pulse is provided to obtain a first original current and a first detection current in the at least one detection signal respectively.

Figure 6:
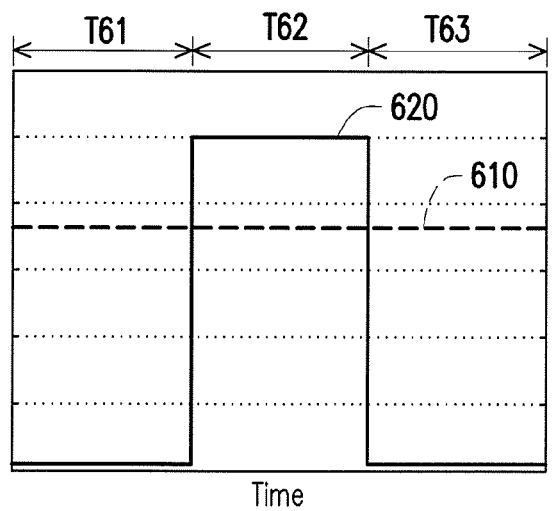
FIG. 6 is a schematic diagram illustrating a waveform in the latch-up test according to an embodiment of the invention.

For instance, FIG. 6 is a schematic diagram illustrating a waveform in the latch-up test according to an embodiment of the invention. As shown in FIG. 6, during periods T61 to T63, the signal generator 110 may provide a power voltage 610 to the power pad of the test chip 210. Further, during the period T62, the signal generator 110 may provide a trigger pulse 620 to the input pad of the test chip 210. Furthermore, before the trigger pulse 620 is provided (i.e., during the period T61), the signal detector 120 may detect the current flowing through the power pad to obtain the first original current. After the trigger pulse 620 is provided (i.e., during the period T63), the signal detector 120 may also detect the current flowing through the power pad to obtain the first detection current. In addition, the trigger pulse 620 may be a positive pulse current, for example. In another embodiment, the trigger pulse 620 may also be a negative pulse current, for example.

With respect to the detailed steps in step S230, as shown in step S540, the controller 130 may compare the first detection current with the first original current, so as to determine whether the first detection current is greater than the first original current. Furthermore, when the first detection current is greater than the first original current, as shown in step S550, the controller 130 may determine that the test chip 210 is in the latch-up state. On the other hand, when the first detection current is not greater than the first original current, the controller 130 may determine that the test chip 210 is not in the latch-up state.

Figure 7:
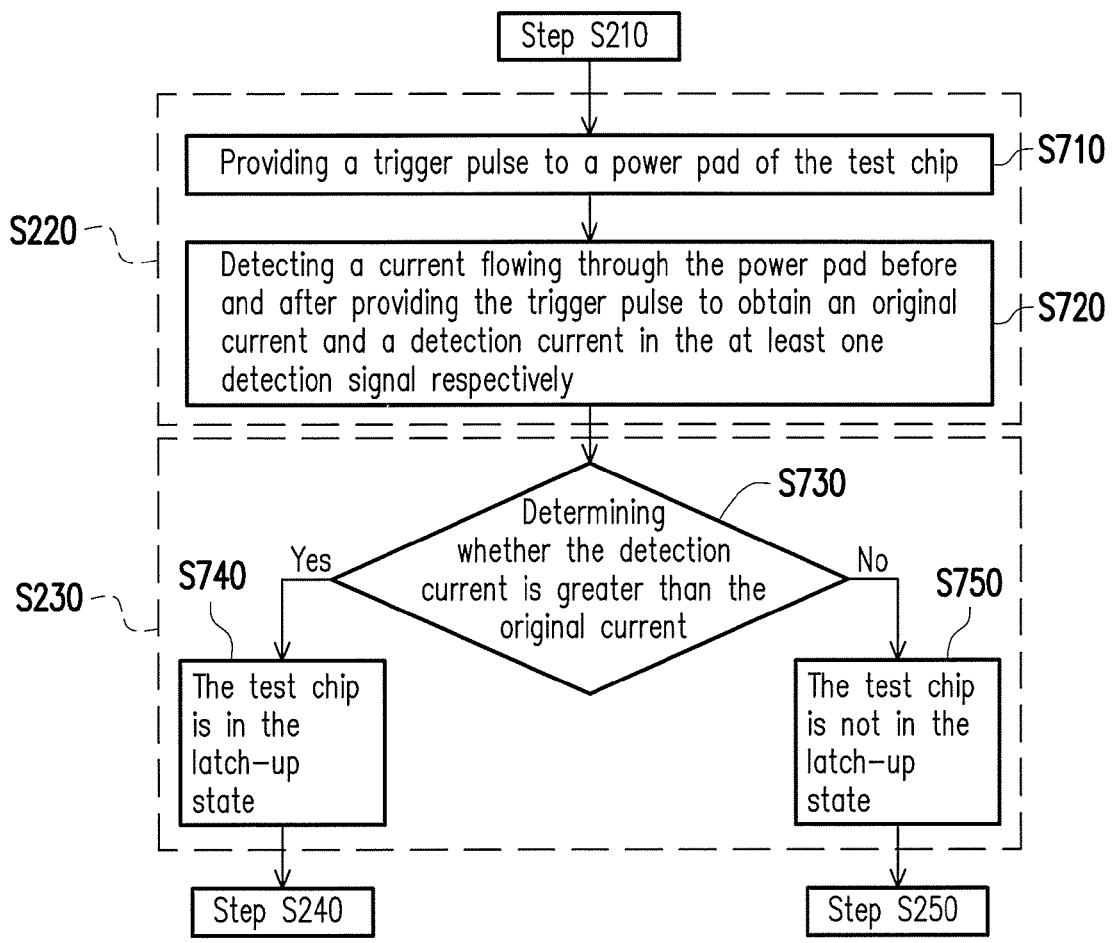
FIG. 7 is a flowchart illustrating detailed steps in steps S220 and S230 according to yet another embodiment of the invention.
Figure 8:
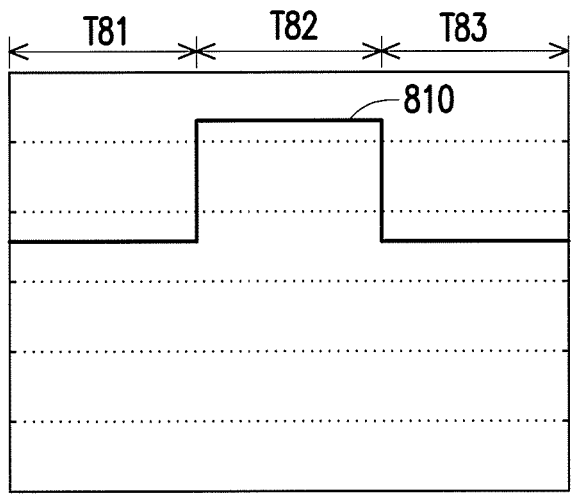
FIG. 8 is a schematic diagram illustrating a waveform in the latch-up test according to an embodiment of the invention.

FIG. 7 is a flowchart illustrating detailed steps in steps S220 and S230 according to yet another embodiment of the invention, and FIG. 8 is a schematic diagram illustrating a waveform in the latch-up test according to an embodiment of the invention. With respect to the detailed steps in step S220, as shown in step S710, the signal generator 110 may provide a trigger pulse to a power pad of the test chip 210. For instance, referring to FIG. 8, during a period T82, the signal generator 110 may provide a trigger pulse 810 to the power pad of the test chip 210, and the trigger pulse 810 may be a positive pulse voltage, for example.

Furthermore, as shown in step S720, the signal detector 120 may detect a current flowing through the power pad before and after the trigger pulse is provided to obtain an original current and a detection current in the at least one detection signal respectively. For instance, referring to FIG. 8, before the trigger pulse 810 is provided (i.e., during a period T81), the signal detector 120 may detect the current flowing through the power pad to obtain the original current. After the trigger pulse 810 is provided (i.e., during a period T83), the signal detector 120 may also detect the current flowing through the power pad to obtain the detection current.

With respect to the detailed steps in step S230, as shown in step S730, the controller 130 may compare the detection current with the original current so as to determine whether the detection current is greater than the original current. Further, when the detection current is greater than the original current, as shown in step S740, the controller 130 may determine that the test chip 210 is in the latch-up state. On the other hand, when the detection current is not greater than the original current, as shown in step S750, the controller 130 may determine that the test chip is not in the latch-up state.

In summary, the invention is capable of adjusting the test range and selecting the corresponding basic test value in response to the test range, so as to set the trigger pulse for the test on the wafer under test. Accordingly, the number of tests may be effectively reduced to facilitate in reduction of the testing time. In addition, the invention is capable of performing the latch-up test at the chip fabrication stage, such that the production cost and the production time may be effectively reduced for the integrated circuit.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A latch-up test method, comprising:
performing a set operation for selecting one of a plurality of test values covered by a test range as a basic test value, and setting a trigger pulse and a predetermined error value by using the basic test value, wherein the basic test value divides the test range into a first sub-range and a second sub-range;
transmitting the trigger pulse to a test chip in a wafer under test to perform a test on the test chip, and detecting a signal from the test chip to obtain at least one detection signal;
determining whether the test chip is in a latch-up state according to the at least one detection signal;
when determining that the test chip is not in the latch-up state, keeping the latch-up threshold value at the same value, updating the test range according to the first sub-range and returning to the step of performing the set operation;
when determining that the test chip is in the latch-up state and a difference between a latch-up threshold value and the basic test value is greater than the predetermined error value, updating the latch-up threshold value according to the basic test value, updating the test range according to the second sub-range, and returning to the step of performing the set operation; and
when determining that the test chip is in the latch-up state and the difference between the latch-up threshold value and the basic test value is not greater than the predetermined error value, stopping the test on the test chip.

2. The latch-up test method of claim 1, wherein the step of transmitting the trigger pulse to the test chip in the wafer under test to perform the test on the test chip, and detecting the signal from the test chip to obtain the at least one detection signal comprises:
providing a power voltage to a power pad of the test chip;
providing the trigger pulse to an input pad of the test chip; and
detecting a current flowing through the power pad before and after providing the trigger pulse to obtain a first original current and a first detection current in the at least one detection signal respectively.

3. The latch-up test method of claim 2, wherein the step of determining whether the test chip is in the latch-up state according to the at least one detection signal comprises:
comparing the first detection current with the first original current;
when the first detection current is greater than the first original current, determining that the test chip is in the latch-up state; and
when the first detection current is not greater than the first original current, determining that the test chip is not in the latch-up state.

4. The latch-up test method of claim 1, wherein the step of transmitting the trigger pulse to the test chip in the wafer under test to perform the test on the test chip, and detecting the signal from the test chip to obtain the at least one detection signal comprises:
providing the trigger pulse to a power pad of the test chip;
detecting a current flowing through the power pad before and after providing the trigger pulse to obtain an original current and a detection current in the at least one detection signal respectively.

5. The latch-up test method of claim 4, wherein the step of determining whether the test chip is in the latch-up state according to the at least one detection signal comprises:
comparing the detection current with the original current;
when the detection current is greater than the original current, determining that the test chip is in the latch-up state; and
when the detection current is not greater than the original current, determining that the test chip is not in the latch-up state.

6. A latch-up test device, comprising:
a controller, selecting one of a plurality of test values covered by a test range as a basic test value, and setting a trigger pulse and a predetermined error value by using the basic test value, wherein the basic test value divides the test range into a first sub-range and a second sub-range;
a signal generator, generating the trigger pulse according to the basic test value, and transmitting the trigger pulse to a test chip in a wafer under test so that the latch-up test device performs a test on the test chip; and
a signal detector, detecting a signal from the test chip to obtain at least one detection signal, wherein the controller determines whether the test chip is in a latch-up state according to the at least one detection signal,
when determining that the test chip is not in the latch-up state, the controller keeps the latch-up threshold value at the same value, and the controller updates the test range according to the first sub-range and resets the trigger pulse according to the updated test range so that the latch-up test device performs the test on the test chip again,
when determining that the test chip is in the latch-up state and a difference between a latch-up threshold value and the basic test value is greater than the predetermined error value, the controller updates the latch-up threshold value according to the basic test value and updates the test range according to the second sub-range so that the latch-up test device performs the test on the test chip again, and
when the controller determines that the test chip is in the latch-up state and the difference between the latch-up threshold value and the basic test value is not greater than the predetermined error value, the latch-up test device stops the test on the test chip.

7. The latch-up test device of claim 6, wherein the signal generator provides a power voltage to a power pad of the test chip and provides the trigger pulse to an input pad of the test chip,
- before the trigger pulse is provided, the signal detector detects a current flowing through the power pad to obtain a first original current in the at least one detection signal, and after the trigger pulse is provided, the signal detector detects a current flowing through the power pad to obtain a first detection current in the at least one detection signal,
- the controller compares the first detection current with the first original current, the controller determines that the test chip is in the latch-up state when the first detection current is greater than the first original current, and the controller determines that the test chip is not in the latch-up state when the first detection current is not greater than the first original current.

8. The latch-up test device of claim 6, wherein the signal generator provides the trigger pulse to a power pad of the test chip,
- before and after the trigger pulse is provided, the signal detector detects a current flowing through the power pad to obtain an original current and a detection current in the at least one detection signal respectively,
- the controller compares the detection current with the original current, the controller determines that the test chip is in the latch-up state when the detection current is greater than the original current, and the controller determines that the test chip is not in the latch-up state when the detection current is not greater than the original current.

* * * * *